United States Patent [19]

Hara et al.

[11] Patent Number: 5,413,167
[45] Date of Patent: May 9, 1995

[54] WAFER COOLING DEVICE

[75] Inventors: Shinichi Hara, Yokohama; Ryuichi Ebinuma, Machida, both of Japan

[73] Assignee: Canon Kabushiki Kaisha, Tokyo, Japan

[21] Appl. No.: 235,146

[22] Filed: Apr. 28, 1994

Related U.S. Application Data

[63] Continuation of Ser. No. 733,838, Jul. 22, 1991, abandoned.

[30] Foreign Application Priority Data

Jul. 30, 1990 [JP] Japan .................................. 2-199103

[51] Int. Cl.⁶ ................................................ F28F 5/00
[52] U.S. Cl. .................................. 165/86; 165/104.33; 250/443.1
[58] Field of Search ............. 165/46, 80.4, 86, 104.27, 165/104.33; 250/441.11, 442.11, 443.1

[56] References Cited

U.S. PATENT DOCUMENTS

| | | | |
|---|---|---|---|
| 3,604,503 | 9/1971 | Feldman, Jr. .................. | 165/46 |
| 4,023,616 | 5/1977 | Scherbaum .................... | 165/80.4 |
| 4,296,796 | 10/1981 | Wulf ............................... | 165/46 |
| 4,733,331 | 3/1988 | Chauvet ......................... | 165/80.5 X |
| 5,066,131 | 11/1991 | Iwata et al. .................... | 165/80.4 |

FOREIGN PATENT DOCUMENTS

| | | |
|---|---|---|
| 0348838 | 1/1990 | European Pat. Off. . |
| 2417106 | 10/1975 | Germany . |
| 58-96992 | 6/1983 | Japan . |
| 59-117128 | 7/1984 | Japan . |
| 61-172357 | 8/1986 | Japan . |
| 63-98119 | 4/1988 | Japan . |
| 63-193447 | 8/1988 | Japan . |
| 2100311 | 4/1990 | Japan . |

OTHER PUBLICATIONS

Fitton, "Taking Out the Heat," Electronic Engineering, vol. 45, Dec. 1973, pp. 65, 67 and 68.
Moran, et al., "Self-Regulating Evaporative/Conductive Thermal Link," IBM Technical Bulletin, vol. 21, No. 8, Jan. 1979, pp. 3281 through 3282.
Patent Abstracts of Japan, Kokai No. 63-65066, vol. 12, No. 297, Aug. 1988.
Patent Abstracts of Japan, Kokai No. 01-104349, vol. 13, No. 326, Apr. 1989.

*Primary Examiner*—Allen J. Flanigan
*Attorney, Agent, or Firm*—Fitzpatrick, Cella, Harper & Scinto

[57] ABSTRACT

A wafer cooling device includes a wafer chuck; a heat exchanger having an internal structure for circulation of cooling water therethrough; and a flexible heat pipe for providing heat communication between the wafer chuck and the heat exchanger.

5 Claims, 8 Drawing Sheets

WAFER COOLING DEVICE

This application is a continuation of prior application, Ser. No. 07/733,838 filed Jul. 22, 1991, now abandoned.

FIELD OF THE INVENTION AND RELATED ART

This invention relates to a wafer cooling device and, more particularly, to a wafer cooling device for use in an X-ray exposure apparatus, wherein vibration of a wafer due to the flow of cooling water is suppressed.

With increasing capacity of a semiconductor device, particularly, a semiconductor memory, enhancement of pattern detail in a semiconductor device manufacturing apparatus has been strongly desired.

As an attempt to accomplish this, an X-ray exposure apparatus using synchrotron radiation as a light source has been proposed. In such an apparatus, as compared with a traditional exposure apparatus using deep UV light as a light source, a mask and a wafer are held vertically (Japanese Laid-Open Patent Application, Laid-Open No. 2-100311).

Figure 10:
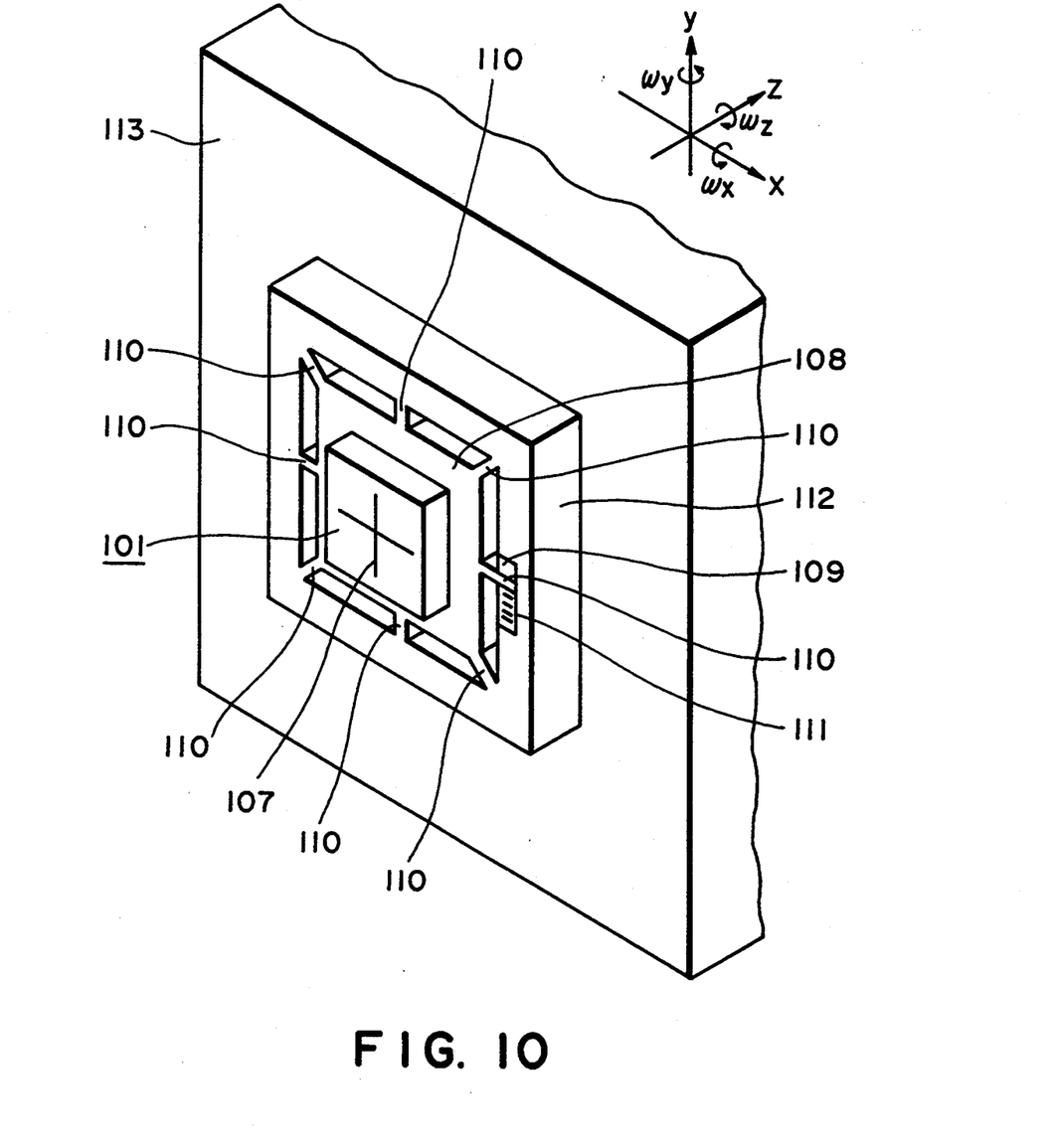
FIG. 10 is a schematic view of a known type wafer holding block.

FIG. 10 is a schematic view showing an example of wafer holding block, used in such an X-ray exposure apparatus.

The wafer holding block includes a rough motion stage 113 for rough alignment of a wafer to a mask in respect to x, y and z axis directions; a support table 112 fixed to the rough motion stage 113; a fine motion stage 108 provided on a central portion of the support table 112, for fine alignment of the wafer to the mask; and a wafer chuck 101 fixed to the fine motion stage 101.

The wafer chuck 108 can be moved by means of the rough motion stage 113, driven by actuators (not shown), in each of the x, y and z axis directions. Also, it can be moved finely by means of the fine motion stage in each of the x, y and z axis directions as well as wX, wY and wZ directions (rotational directions about the x, y and z axes, respectively). For simplicity, however, in FIG. 10 the fine motion stage 108 as can be moved only in the wZ direction is illustrated. More specifically, the fine motion stage 108 is supported at each corner and each center of its four sides by the support table 112 through leaf springs 110. It can be driven by means of a piezoelectric device 111 and a rubber 109, sandwiching the right-hand leaf spring 110 therebetween, and can be moved in the wZ direction minutely. If a piezoelectric device 111 and a rubber 109 are provided for each of the leaf springs 110, in a similar manner sandwiching the corresponding leaf spring therebetween, then the fine motion stage 108 can be driven minutely in each of the x, y and z axis directions as well as in each of the wX, wY and wZ directions. The wafer chuck 101 is formed with crossing grooves 107 for vacuum attraction of a wafer, and these grooves are communicated with a vacuum pump (not shown) through a passageway (not shown).

In such an X-ray exposure apparatus using synchrotron radiation, since a pattern to be transferred to a wafer is very fine, thermal distortion of the wafer attributable to the irradiation with X-rays of an intensity of about 100 mW/cm$^2$ can not be disregarded. Therefore, there is a necessity of a wafer cooling device for cooling a wafer during exposure thereof.

Examples of such wafer cooling device are as follows:

(1) A heat conducting member such as a Hg or metal web or fine copper wires, having freedom and deformability, is interposed between a wafer cooling device and a wafer chuck, or between a wafer and a wafer chuck (Japanese Laid-Open Patent Application, Laid-Open Nos. 59-117128, 61-172357 and 63-193447).

(2) Temperature controlled cooling water is circulated through a wafer chuck 101 to maintain the wafer chuck temperature constant (Japanese Laid-Open Patent Application, Laid-Open No. 63-98119).

(3) A heat pipe is used, with an evaporation portion being defined in a wafer chuck (Japanese Laid-Open Patent Application, Laid-Open No. 63-65066).

SUMMARY OF THE INVENTION

These wafer cooling devices, however, involve some inconveniences such as follows:

(1) In an arrangement wherein a heat conducting member having freedom and deformability is interposed between a wafer cooling device and a wafer chuck or between a wafer and a wafer chuck, it is not easy to retain the flatness necessary for correction of deformation of the wafer (for example, the necessary flatness is 1 micron per an area of 10×10 (cm) or less). Thus, the pattern transfer precision is degraded. Further, generally such a heat conducting material does not have good heat conductivity.

Figure 11:
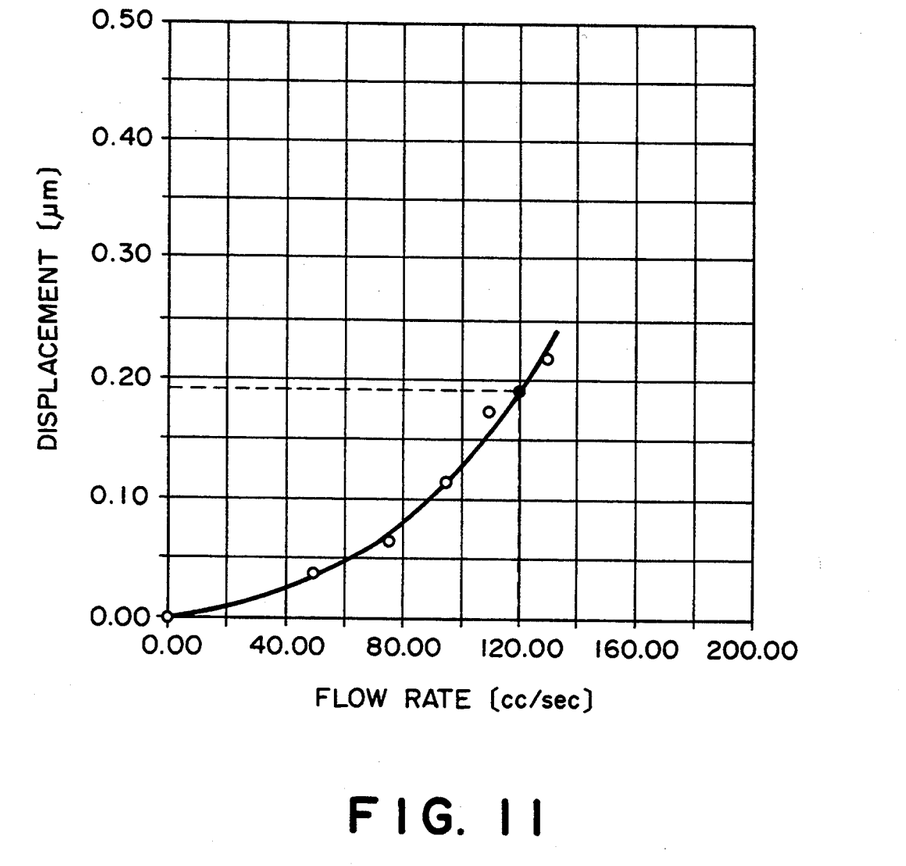
FIG. 11 is a graph showing the result of experiment, illustrating the relationship between the flow rate and the displacement.

(2) In an arrangement wherein temperature controlled cooling water is used to maintain a constant wafer chuck temperature, since the wafer chuck is fixed to the fine motion stage 108 (FIG. 10) of small rigidity, there occurs vibration due to the flow of the cooling water (for example, according to the result of experiment such as shown in FIG. 11, there is a possibility of displacement of about 1.20 micron). This causes degradation of the pattern transfer precision.

(3) In an arrangement wherein a heat pipe system is used, with an evaporation portion being defined in a wafer chuck, due to cooling water supplied to a condensing portion of the heat pipe, there occurs vibration of the wafer chuck. This causes degradation of the pattern transfer precision.

It is accordingly a primary object of the present invention to provide a wafer cooling device capable of cooling a wafer without inconveniences such as described above.

It is another object of the present invention to provide a wafer cooling device by which, during exposure of a wafer with a radiation energy such as X-rays, a synchrotron orbital radiation (SOR), an excimer laser beam or light of g-line or i-line, the wafer can be cooled without degradation of the pattern transfer precision.

In accordance with an aspect of the present invention, there is provided a wafer cooling device, comprising: a wafer chuck; a heat exchanger having an internal structure for circulation of cooling water therethrough; and a flexible heat pipe for providing heat communication between the wafer chuck and the heat exchanger.

The heat pipe may include a middle pipe portion made of a resin material and having an inside surface on which a wick wetted with operative liquid is adhered.

The wafer chuck may have an inside space of reduced pressure having an inside surface on which a wick wetted with operative liquid is adhered.

The heat exchanger may have an inside space of reduced pressure having an inside surface on which a wick wetted with operative liquid is adhered, and the wicks of the heat exchanger and the heat pipe may be connected to each other while the wicks of the wafer chuck and the heat pipe may be connected to each other. The inside spaces of the wafer chuck and the heat exchanger may be communicated with each other by the heat pipe.

In accordance with another aspect of the present invention, there is provided a wafer cooling device for use in an X-ray exposure apparatus having a fine motion stage and a rough motion stage, the device comprising: a wafer chuck fixed to the fine motion stage and having an inside space with an inside surface on which a wick wetted with operative liquid is adhered; a heat exchanger fixed to the rough motion stage and having an internal structure for circulation of cooling water therethrough and an inside space with an inside surface on which a wick wetted with operative liquid is adhered; a flexible pipe for providing communication between the inside space of the heat exchanger and the inside space of the wafer chuck; an operative liquid tank for reserving operative liquid to be supplied to the wick of the wafer chuck; a flexible operative liquid supply passageway for connecting the operative liquid tank with the wick of the wafer chuck; an operative liquid valve provided in a portion of the operative liquid supply passageway; a flexible vacuum supply passageway for connecting the inside space of the wafer chuck with a vacuum source; and a vacuum supply valve provided in a portion of the vacuum supply passageway.

In a wafer cooling device of the present invention, heat resulting from temperature rise in a wafer during exposure is consumed in the evaporation of the operative liquid in the heat pipe and, therefore, the temperature of the wafer can be maintained constant. Since the heat exchanger is fixed to the rough motion stage having high rigidity, it is possible to prevent vibration of the wafer chuck (i.e. vibration of the wafer) due to the circulation of the cooling water. Since the used heat pipe is flexible, it does not obstruct fine alignment of the wafer stage by the fine motion stage.

Where the heat pipe includes a middle pipe portion made of a resin material and having an inside surface on which a wick wetted with operative liquid is adhered, a flexible heat pipe structure can be attained easily.

Where the wafer chuck has an inside space of reduced pressure having an inside surface on which a wick wetted with operative liquid is adhered, the wafer chuck structure can be provided by a similar arrangement as a heat source portion of an ordinary heat pipe device. Thus, it is possible to maintain a wafer as a whole at a constant temperature, efficiently.

In an occasion where the heat exchanger has an inside space of reduced pressure having an inside surface on which a wick wetted with operative liquid is adhered, wherein the wicks of the heat exchanger and the heat pipe are connected to each other while the wicks of the wafer chuck and the heat pipe are connected to each other, and wherein the inside spaces of the wafer chuck and the heat exchanger are communicated with each other by the heat pipe, the wafer cooling device itself can be constructed into a single heat pipe structure. As a result, it is possible to maintain the wafer at a constant temperature, efficiently.

Where the cooling device is equipped with a flexible pipe for providing communication between the inside space of the heat exchanger and the inside space of the wafer chuck, and means for supplying the operative liquid to the wick of the wafer chuck, the operative liquid evaporated from the wick of the wafer chuck can be moved to the heat exchanger through the pipe and, additionally, it is possible to replenish the wick of the wafer chuck with the operative liquid appropriately. Thus, similar advantageous effects result.

DESCRIPTION OF THE PREFERRED EMBODIMENTS

Figure 1:
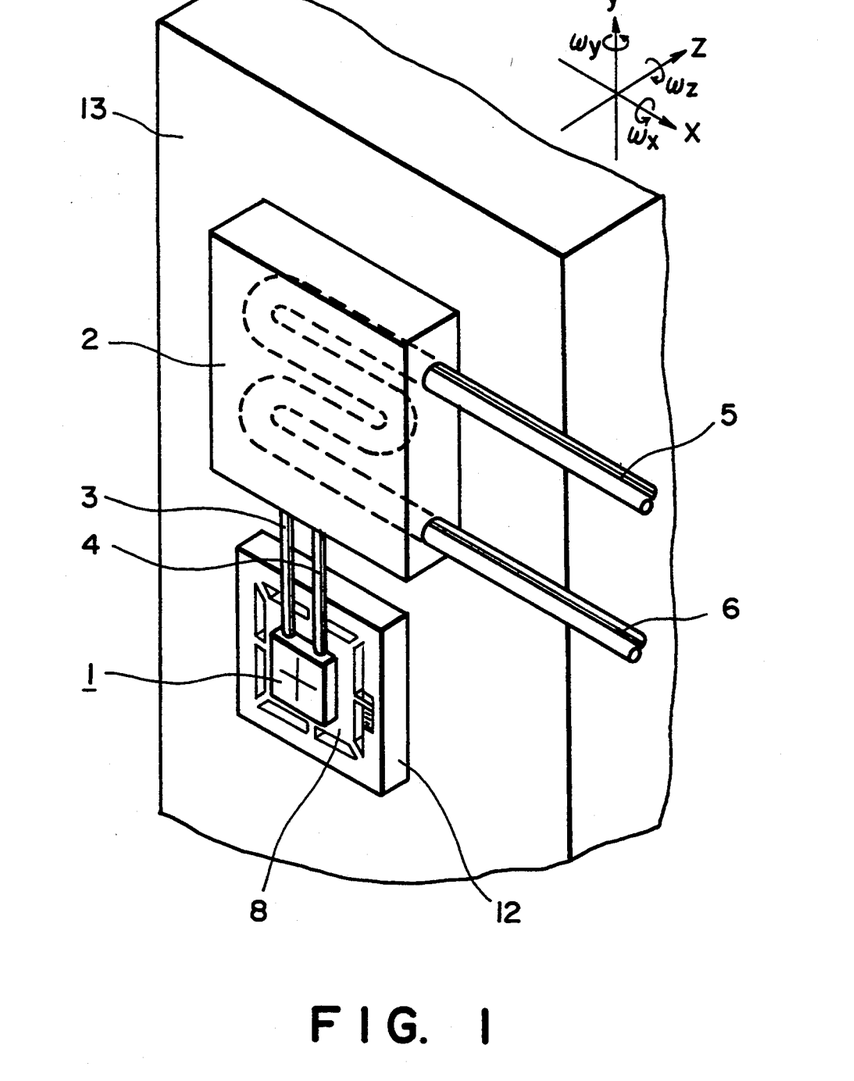
FIG. 1 is a schematic view of a wafer holding block, showing a wafer cooling device according to a first embodiment of the present invention.

FIG. 1 is a schematic view of a wafer holding block, for explaining a wafer cooling device according to a first embodiment of the present invention, wherein the device is used in an X-ray exposure apparatus.

The wafer holding block includes a rough motion stage 13 for rough alignment of a wafer to a mask in respect to x, y and z axis directions; a support table 12 fixed to the rough motion stage 13; a fine motion stage 8 provided on a central portion of the support table 12, for fine alignment of the wafer to the mask; and a wafer chuck 1 fixed to the fine motion stage 8.

Figure 2:
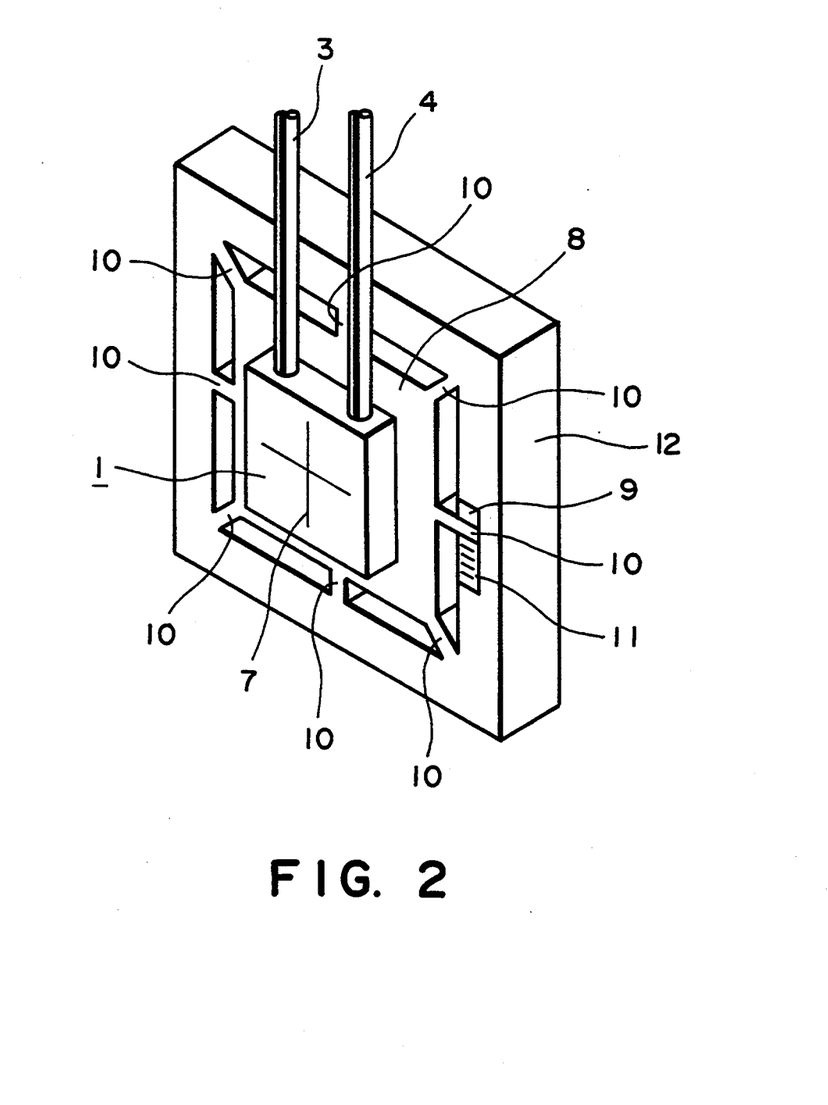
FIG. 2 is an enlarged view of a support table of FIG. 1.

The wafer chuck 1 can be moved by means of the rough motion stage 13, driven by actuators (not shown), in each of the x, y and z axis directions. Also, it can be moved finely by means of the fine motion stage in each of the x, y and z axis directions as well as wX, wY and wZ directions (rotational directions about the x, y and z axes, respectively). For simplicity, however, in this embodiment the fine motion stage 8, which can be moved only in the wz direction, is used. More specifically, as best seen in FIG. 2 the fine motion stage 8 is supported at each corner and each center of its four sides by the support table 12 through leaf springs 10. It can be driven by means of a piezoelectric device 11 and a rubber 9, sandwiching the right-hand leaf spring 10 therebetween, and can be moved in the wZ direction minutely. If a pair of a piezoelectric device 11 and a rubber 9 are provided for each of the leaf springs 10, in a similar manner sandwiching the corresponding leaf spring therebetween, then the fine motion stage 8 can be driven minutely in each of the x, y and z axis directions as well as in each of the wX, wY and wZ directions. The wafer chuck 1 is formed with crossing grooves 7 for vacuum attraction of a wafer, and these grooves are communicated with a vacuum pump (not shown) through a passageway (not shown). The portion of this embodiment described above is essentially the same as the FIG. 10 example.

Figure 3:
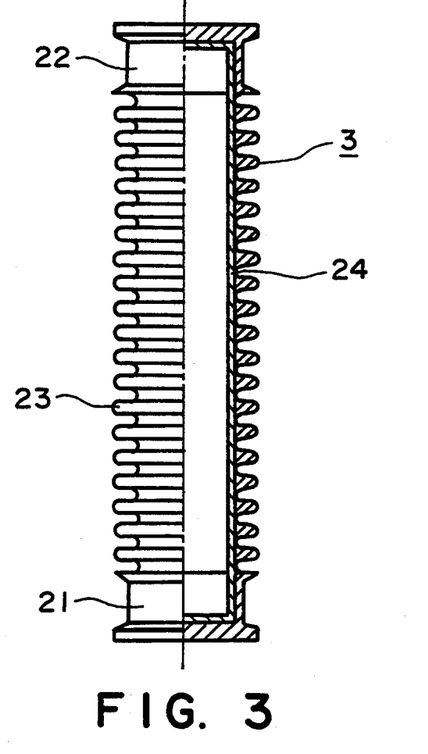
FIG. 3 is a sectional view showing the structure of a heat pipe of FIG. 1.

However, in this embodiment, the wafer chuck 1 is made of an Al material having a good heat conductivity and, additionally, a heat exchanger 2 made of an Al material with good heat conductivity and having therein a passageway coupled with two cooling water pipes 5 and 6 for circulation of cooling water is fixedly provided on the rough motion stage 13. Further, two flexible heat pipes 3 and 4 are used to provide heat transmission between the wafer chuck 1 and the heat exchanger 2. This is a difference from the known example. As seen in FIG. 3, each of the heat pipes 3 and 4 includes opposite end portions 21 and 22, being made of an Al material with good heat conductivity and a central pipe portion being made of a resin material with heat resistivity such as Teflon, and a wick 24 wetted with operative liquid such as water or alcohol is adhered to the inside surface of the pipe. The inside space of each heat pipe 3 or 4 is maintained at a reduced pressure, so as to retain a boiling point of the operative liquid at about 20.0° C.

The operation of this wafer holding block will now be explained.

A large quantity of cooling water, temperature controlled at about 20.0° C., is supplied from a constant temperature vessel (not shown) to the heat exchanger 2 through the cooling water pipe 5. With the flow of the cooling water through the passageway in the heat exchanger 2 and through the cooling water pipe 6 back to the constant temperature vessel, the heat exchanger 2 can be maintained at a temperature of about 20.0° C. Here, since the heat exchanger 2 is fixed to the rough motion stage having high rigidity, the flow of large quantity of cooling water does not cause vibration.

A wafer onto which a mask pattern is to be transferred is conveyed by a known type conveying hand (not shown) to the position of the wafer chuck 1 and, after this, with the communication between the crossed grooves 7 with the vacuum pump the wafer is vacuum attracted to the wafer chuck 1. Thereafter, the rough motion stage 13 is driven by the actuator (not shown), and the fine motion stage 8 is driven by the piezoelectric device 11, whereby the alignment of the wafer with respect to the mask can be accomplished.

After completion of this alignment, the exposure process of the wafer with radiation such as X-rays, for example, starts. If during the exposure the temperature of the wafer increases due to the irradiation with the X-rays or the like, the temperature of the wafer chuck rises, too. However, since the wafer chuck 1 is made of an Al material having good heat conductivity, the temperature rise in the wafer chuck is uniform, as a whole. Because of this temperature rise, the temperature of the contact portion 21 of each of the two heat pipes 3 and 4, being in contact with the wafer chuck 1, increases which in turn raises the temperature of the wick 24 adhered to the inside surface of the contact portion 21 of each heat pipe 3 or 4. This causes a rise in saturated vapor pressure thereof, and the operative liquid within the wick 24 is evaporated, with deprivation of heat of evaporation. Due to the pressure distribution produced at this time in each heat pipe 3 or 4, the vapors of the operative liquid instantaneously move to the contact portion 22 of each heat pipe 3 or 4, at the heat exchanger 2 side. Here, since the heat exchanger 2 is temperature controlled at about 20.0° C. and thus the contact portion 22 of each heat pipe 3 or 4 is maintained at about 20.0° C., the vapors of the operative liquid are condensed into liquid and absorbed again by the wick 24. The absorbed operative liquid is diffused by the capillary action of the wick 24, back to the portion of the wick 24 adjacent to the contact portion 21 of each heat pipe 3 or 4.

Consequently, if the temperature of the wafer rises during the exposure, almost all the heat resulting from the temperature rise is exhausted in the evaporation of the operative liquid in the heat pipes 3 and 4 and, therefore, the wafer can be maintained at a constant temperature.

If water is used as the operative liquid, the inside of each heat pipe 3 or 4 may be maintained at a reduced pressure of about 20 Torr so as to retain the boiling point of the water at about 20.0° C. On the other hand, since in an X-ray exposure apparatus a helium gas of a pressure of about 200 Torr is preferably used as an ambience gas for a wafer chuck 1, for preventing the attenuation of X-rays, there is a pressure difference of about 180 Torr between the inside and outside of each heat pipe 3 or 4. In consideration thereof, the central pipe portion 23 of each heat pipe 3 or 4 may be made of a resin material such as Teflon, with a diameter of 20 mm or less and a thickness of 1 mm or more. Further, the outside configuration of each heat pipe 3 or 4 may be shaped into a corrugated form such as shown in FIG. 3 to provide a flexibility such that, with fine positioning of the wafer through the fine motion stage 8, the heat pipe 3 or 4 can be displaced minutely in the x, y and z axis directions and the wX, wy and wz directions in FIG. 1.

Since the pressure difference between the inside and outside of each heat pipe 3 or 4 is about 200 Torr, at the maximum, an operative liquid other than water can be used in combination with a resin material structure of the pipe portion 23 of each heat pipe 3 or 4, without specific inconvenience. Further, a metal such as Al material may be used for the pipe portion 23 of each heat pipe 3 or 4 and, with a similar structure, the flexibility can be assured.

Figure 4:
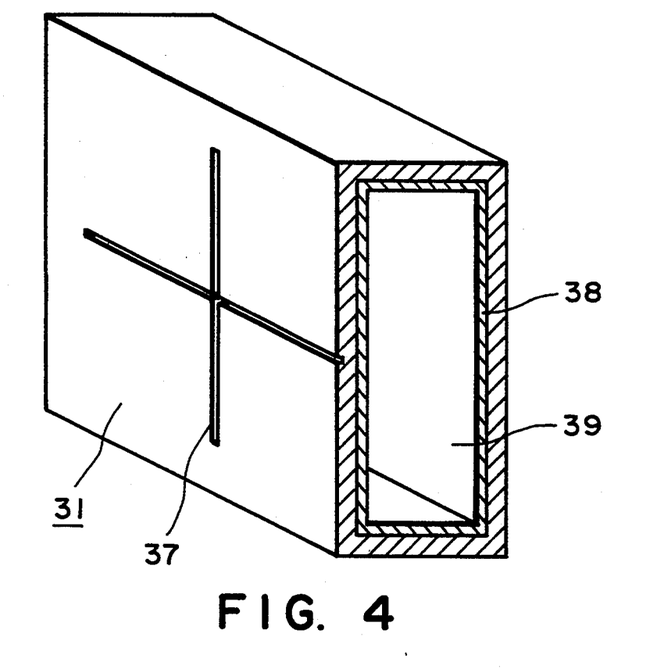
FIG. 4 is a schematic view of a wafer chuck in a wafer cooling device according to a second embodiment of the present invention.

FIG. 4 is a schematic view of a wafer chuck, in a wafer cooling device according to a second embodiment of the present invention, wherein the device is used in an X-ray exposure apparatus.

The wafer cooling device of this embodiment differs from the FIG. 1 embodiment in the point of structure of a wafer chuck 31. More specifically, as shown in FIG. 4, the wafer chuck 31 is made of an Al material having good heat conductivity, and it is formed with crossed grooves 37. This is similar to the wafer chuck 1 shown in FIG. 1. However, what is different from the FIG. 1 example is that it has an inside space 39 of reduced pressure, having a wick 38 adhered to its inside surface. The inside space 39 of the wafer chuck 31 is maintained at a reduced pressure, attaining a boiling point of the operative liquid at about 20.0° C.

In the wafer cooling device of this embodiment, if the temperature of a wafer increases during the exposure process, the temperature of the wafer chuck 31 rises which in turn causes a temperature rise in the contact portion of each of the two unshown heat pipes (see FIG. 1) at the wafer chuck 31 side, contacting to the wafer chuck 31. Because of this temperature rise, the temperature of the wick adhered to the inside surface of each heat pipe increases, causing evaporation of the operative liquid within the wick, with deprivation of heat of evaporation. Due to the pressure distribution produced at this time in each heat pipe, the vapors of the operative liquid instantaneously move to the contact portion of each heat pipe, at the heat exchanger side. Here, since the heat exchanger is temperature controlled at about 20.0° C. (as the heat exchanger 2 of FIG. 1) and thus the contact portion of each heat pipe is maintained at about 20.0° C., the vapors of the operative liquid are condensed into liquid and absorbed again by the wick. The absorbed operative liquid is diffused by the capillary action of the wick, back to the portion of the wick adjacent to the contact portion of each heat pipe.

As a result, the portion of the wafer chuck contacting the two heat pipes can be maintained at a temperature of about 20.0° C. constantly.

On the other hand, if during the exposure the temperature of the wafer increases, the temperature of the wick 38 adhered to the inside surface of the wafer chuck rises, too. As a result, the operative liquid within the wick 38 is evaporated with deprivation of heat of evaporation. Due to the pressure distribution produced at this time in the inside space 39 of the wafer chuck 31, the vapors of the operative liquid instantaneously move to the portion of the wafer chuck 31 contacted to the two heat pipes. Here, since this portion of the wafer chuck 31 is temperature controlled at about 20.0° C. as described hereinbefore, the vapors of the operative liquid are condensed into liquid and absorbed again by the wick 38. The absorbed operative liquid is diffused by the capillary action of the wick 38, back to the portion of the wick 38 whereat the wafer is attracted to the chuck.

Consequently, if the temperature of the wafer rises during the exposure, almost all the heat resulting from the temperature rise is exhausted in the evaporation of the operative liquid in the wafer chuck 31 and in the two heat pipes and, therefore, the wafer can be maintained at a constant temperature.

Figure 5:
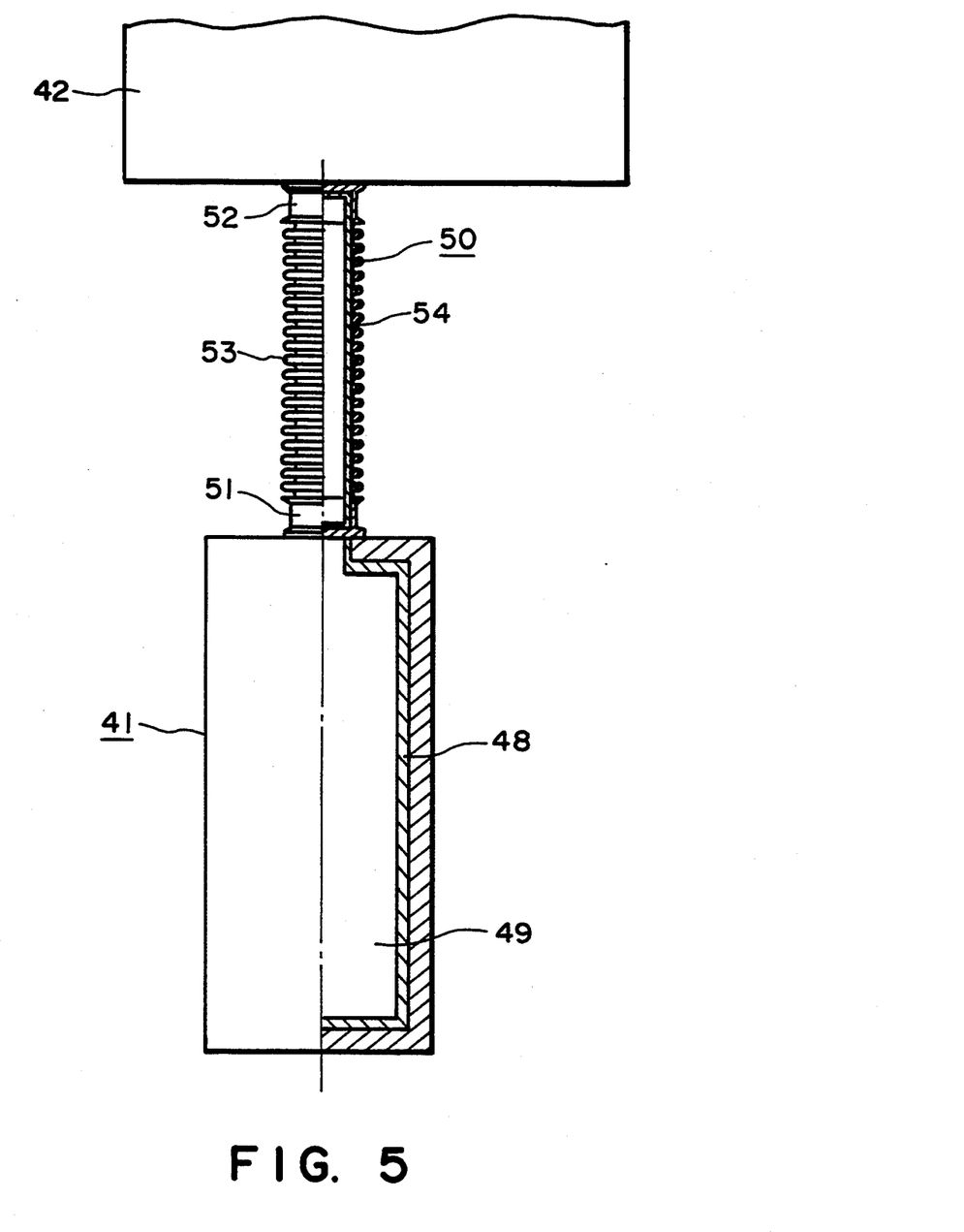
FIG. 5 is a sectional view showing the connection between a wafer chuck and a heat pipe, in a wafer cooling device according to a third embodiment of the present invention.

FIG. 5 shows the connection between a wafer chuck 41 and a heat pipe 50, in a wafer cooling device according to a third embodiment of the present invention, wherein the device is used in an X-ray exposure apparatus.

The wafer cooling device of this embodiment is similar to that shown in FIG. 4, in that: the wafer chuck 41 is made of an Al material or the like having good heat conductivity; it is formed with crossed grooves (not shown) for vacuum attraction of a wafer; it has an inside space 49 of reduced pressure; and a wick 48 wetted with an operative liquid is adhered to the inside surface thereof. This embodiment differs from the FIG. 4 embodiment in that: the heat pipe 50 has a contact portion 51 at the wafer chuck 41 side which is shaped into a doughnut form; and a contact portion of the wafer chuck 41 contacting the heat pipe 50 has formed therein an opening of a size substantially equal to the inside diameter of the heat pipe 50, for connection between a wick 48 of the wafer chuck 41 and a wick 54 of the heat pipe 50 and for communication between the inside space of the wafer chuck 41 and the inside space of the heat pipe 50. Each of the inside spaces of the wafer chuck 41 and the heat pipe 50 is maintained at a reduced pressure, retaining a boiling point of the operative liquid at about 20.0° C.

In the wafer cooling device of this embodiment, if during the exposure the temperature of the wafer increases, the temperature of the wick 48 adhered to the inside surface of the wafer chuck 41 rises, too. As a result, the operative liquid within the wick 48 is evaporated with deprivation of heat of evaporation. Due to the pressure distribution produced at this time in the inside spaces of the wafer chuck 41 and the heat pipe 50, the vapors of the operative liquid instantaneously move to the contact portion 52 of the heat pipe 50 via the portion of the wafer chuck 41 contacted to the heat pipe 50, via the contact portion 51 of the heat pipe and via the inside space of the pipe 53. Here, since the contact portion 52 is temperature controlled at about 20.0° C. constantly by means of a heat exchanger 42 of a similar structure as of that shown in FIG. 1, the vapors of the operative liquid coming to the contact portion 52 are condensed into liquid and absorbed again by the wick 54. The absorbed operative liquid is diffused by the capillary action of the wick 54, back to the wick 54 at the contact portion 51 of the heat pipe 50 and then to the wick 48 at that portion of the wafer chuck 41 and finally to the wick 48 at the portion of the wafer chuck 41 whereat the wafer is attracted to the chuck.

Consequently, if the temperature of the wafer rises during the exposures almost all the heat resulting from the temperature rise is exhausted in the evaporation of the operative liquid in the wafer chuck 41 and, therefore, the wafer can be maintained at a constant temperature.

Figure 6:
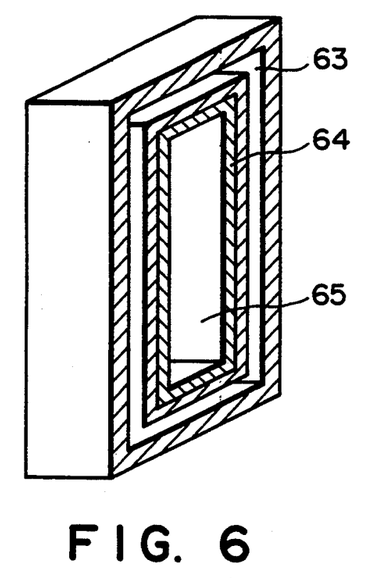
FIG. 6 is a schematic view showing the structure of a heat exchanger.
Figure 7:
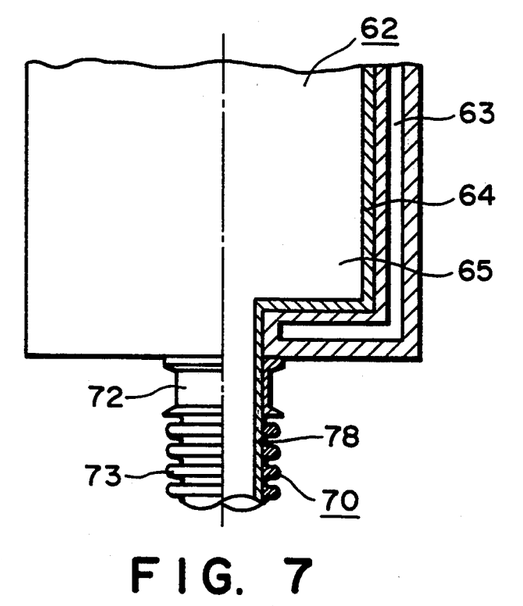
FIG. 7 is a sectional view showing the connection between a heat exchanger and a heat pipe.

FIG. 6 shows the structure of a heat exchanger 62 in a wafer cooling device according to a fourth embodiment, wherein the device is used in an X-ray exposure apparatus. FIG. 7 shows the connection of the heat exchanger 62 of FIG. 6 with a heat pipe 70.

In the wafer cooling device of the present embodiment, a wafer chuck (not shown) and the heat pipe 70 as well as the heat exchanger 62 are structured into a unit heat pipe assembly, and the wafer chuck has a similar structure as of the wafer chuck 41 shown in FIG. 5. As seen in FIG. 6, the heat exchanger 62 has an inside space of reduced pressure, and a wick 64 wetted with an operative liquid is adhered to the inside surface thereof. Also, a cooling water flowing groove 63 is formed, for circulation of cooling water therethrough. A contact portion of the heat pipe 70 at the heat exchanger 62 side is shaped into a doughnut form. At a portion of the heat exchanger 62 contacted to the heat pipe 70, there is formed an opening of a size substantially equal to the inside diameter of the heat pipe. This assures connection of the wick 64 of the heat exchanger 62 with a wick 78 of the heat pipe 70 as well as communication between the inside space 65 of the heat exchanger 62 and an inside space of the wafer chuck through the heat pipe 70.

Since the wafer cooling device of this embodiment has a unit heat pipe structure as described above, the wafer temperature can be maintained constant in accordance with the heat pipe principle which is known per se.

Figure 8:
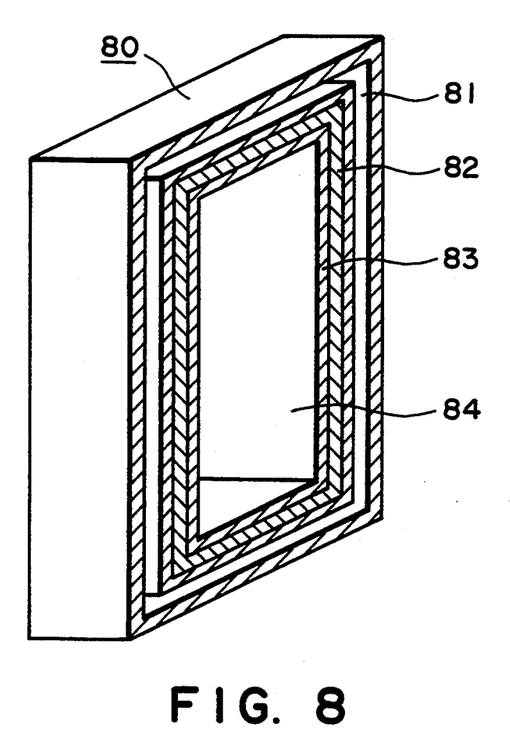
FIG. 8 is a schematic view showing the structure of a modified form of heat exchanger.

The heat exchanger structure may be modified as a heat exchanger 80 shown in FIG. 8. More specifically, an outer casing member made of a material having good heat conductivity is formed with a cooling water flowing groove 81. A container 82 made of a material with good heat conductivity has an inside space of reduced pressure, and a wick 83 wetted with an operative liquid is adhered to the inside surface thereof. The container 82 is disposed within the outer casing member with its outside surface being contacted to the inside surface of the outer casing member. In this case, the outside casing member and the container 82 may be made of different materials.

Figure 9:
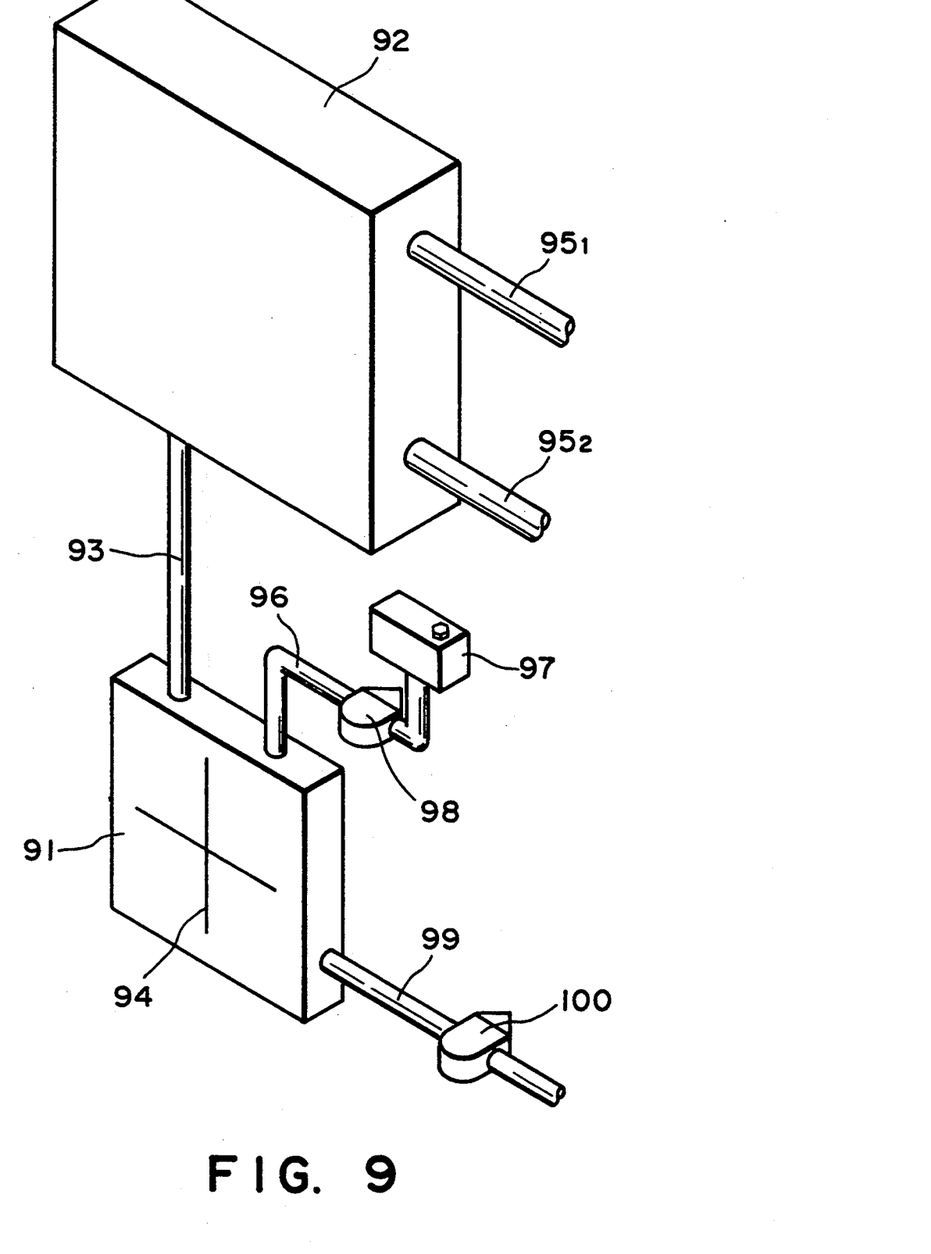
FIG. 9 is a schematic view of a wafer cooling device according to a fourth embodiment of the present invention.

FIG. 9 is a schematic view of a wafer cooling device according to a fifth embodiment of the present invention, wherein the device is used in an X-ray exposure apparatus.

The wafer cooling device of this embodiment includes: a flexible pipe 93 substituting for the heat pipe 70 in the wafer cooling device of FIG. 8, for communicating the inside space of a wafer chuck 91 with the inside space of a heat exchanger 92; an operative liquid tank 97 for reserving operative liquid to be supplied to a wick within the wafer chuck 91; a flexible operative liquid passageway 96 for communicating the tank 97 with the wick in the wafer chuck 91; an operative liquid valve 98 provided in a portion of the passageway 96; a flexible vacuum applying passageway 99 for communicating the inside space of the wafer chuck 91 with a vacuum source (not shown); and a vacuum applying valve 100 provided in a portion of the passageway 99. The tank 97, the passageway 96, the valve 98, the passageway 99 and the valve 100 cooperate with each other to provide a replenishing means for supplying operative liquid to the wick in the wafer chuck 91.

While not shown in the drawing, like the FIG. 1 example, the wafer chuck 91 is fixed to a fine motion stage and the heat exchanger 92 is fixed to a rough motion stage. Further, where the pipe 93 and the passageways 96 and 99 each has a similar structure of the heat pipe 3 shown in FIG. 3, even if they are made of metal, the fine positioning of a wafer through the fine motion stage is attainable.

With the arrangement describe above, the wafer cooling device of this embodiment has a functionally integral heat pipe structure and, similarly to the example of FIG. 7, it maintains a constant wafer temperature on the basis of the heat pipe principle which is known per se.

More specifically, if during the exposure the temperature of the wafer increases, the temperature of the wick adhered to the inside surface of such portion of the wafer chuck 91 whereat the wafer is vacuum attracted, rises, too. As a result, the operative liquid within the wick is evaporated with deprivation of heat of evaporation. Due to the pressure distribution in the inside spaces of the wafer chuck 91, the pipe 93 and the heat exchanger 92, the vapors of the operative liquid instantaneously move to the portion of the wafer chuck 91 contacted to the pipe 93 and via the pipe 93 to the heat exchanger 92. Therefore, if the temperature of the wafer rises during the exposure, almost all the heat resulting from this temperature rise is exhausted in the evaporation of the operative liquid in the wafer chuck 91 and, thus, the wafer temperature can be maintained constant.

In the wafer cooling device of this embodiment, the heat exchanger 92 has a similar structure as of the heat exchanger 62 shown in FIGS. 6 and 7, and a constant temperature is retained by means of cooling water which is circulated by two cooling water flowing passageways $95_1$ and $95_2$. Thus, the vapors of the operative liquid coming to the heat exchanger 92 are condensed within the heat exchanger into liquid and absorbed by the wick within the heat exchanger 92. Since however the pipe 93 is not provided with a wick, the operative liquid liquefied by the condensation does not go back to the wafer chuck 91. This causes a phenomenon that, as the exposure is repeated, the operative liquid in the wafer chuck 91 reduces which ends in failure of wetting the wick in the wafer chuck with the operative liquid. If such phenomenon occurs, the temperature rise of the wafer is not followed by evaporation of the operative liquid with deprivation of heat of evaporation. This is called "dry-out".

In the present embodiment, to avoid such dry-out state, the operative liquid valve is opened at regular intervals to replenish the wick in the wafer chuck 91 with the operative liquid, from the tank 97 through the passageway 96. Here, before replenishment of the operative liquid, the vacuum applying valve 100 is opened to provide communication between the vacuum source and the inside space of the wafer chuck 91, to apply vacuum to the latter. This causes evaporation of all the operative liquid within the wafer chuck 91 and the heat exchanger 92 (since the saturated vapor pressure at a temperature of about 20.0° C. is about 20 Torr, under vacuum or under 0 Torr all the operative liquid is evaporated). The vapors can be discharged through the vacuum passageway 99.

If the operative liquid and the wick do not have good adaptability, a non-condensable gas is produced in the wafer chuck 91 resulting in an inoperable state. If this occurs, the vacuum applying valve 100 may be opened to provide communication between the vacuum pump and the inside space of the wafer chuck 91 through the passageway 99, for effect the vacuum application again. After this, the operative liquid valve 98 is opened to supply the operative liquid to the wick in the wafer chuck through the operative liquid passageway 96. By this, the normal operation can be resumed.

While in this embodiment the operative liquid collected in the heat exchanger 92 is discharged through the vacuum applying passageway 99, a separate liquid discharging means may be used.

In the foregoing description, the wafer chuck and the heat exchanger communicate by means of two heat pipes (FIG. 1). However, the number may be one or three or more.

The inside space of each of the wafer chuck, the heat pipe and the heat exchanger is maintained at a reduced pressure to retain a boiling point of the operative liquid at a temperature of about 20.0° C. However, the pressure is not limited to this. Only necessary is that the pressure is reduced to assure that the boiling point of the operative liquid is equal to the temperature of the cooling water (it may be other than 20.0° C.) circulating through the heat exchanger.

Further, in order to assure the strength of the wafer chuck or the heat exchanger, a support pillar means may be provided within the wafer chuck of the heat exchanger, such as disclosed in Japanese Laid-Open Patent Application, Laid-Open No. 58-96992.

The groove of the wafer chuck for the vacuum attraction is not limited to a crossed shape. A radially extending shape or any other shape may be used.

While the invention has been described with reference to the structures disclosed herein, it is not confined to the details set forth and this application is intended to cover such modifications or changes as may come within the purposes of the improvements or the scope of the following claims.

What is claimed is:

1. A wafer cooling device for use in an exposure apparatus, said device comprising:
   a wafer chuck for chucking a wafer;
   a fine-motion stage on which said wafer chuck is mounted;
   a heat exchanger having an internal structure for circulation of cooling water therethrough, wherein said heat exchanger is mounted at a location other than on said fine-motion stage;
   a rough-motion stage on which said fine-motion stage and said heat exchanger are separately mounted, wherein said rough-motion stage has a higher rigidity than that of said fine-motion stage; and
   a flexible heat pipe system for providing heat communication between said wafer chuck and said heat exchanger.

2. A device according to claim 1, wherein said heat pipe includes a middle pipe portion made of a resin material and having an inside surface on which a wick wetted with operative liquid is adhered.

3. A device according to claim 1 or 2, wherein said wafer chuck has an inside space of reduced pressure having an inside surface on which a wick wetted with operative liquid is adhered.

4. A device according to claim 3, wherein said heat exchanger has an inside space of reduced pressure having an inside surface on which a wick wetted with operative liquid is adhered, wherein said wicks of said heat exchanger and said heat pipe are connected to each other while said wicks of said wafer chuck and said heat pipe are connected to each other, and wherein said inside spaces of said wafer chuck and said heat exchanger are communicated with each other by said heat pipe.

5. A device according to claim 1, wherein said wafer chuck is adapted to hold a wafer thereon, and wherein exposure of the wafer is effected with the wafer being held by said wafer chuck.

* * * * *

UNITED STATES PATENT AND TRADEMARK OFFICE
CERTIFICATE OF CORRECTION

PATENT NO. : 5,413,167
DATED : May 9, 1995
INVENTOR(S) : SHINICHI HARA, ET AL.

It is certified that error appears in the above-indentified patent and that said Letters Patent is hereby corrected as shown below:

ON THE COVER PAGE : Item [30]

Under "FOREIGN PATENT DOCUMENTS"

"2100311" should read --2-100311--.

COLUMN 1, line 28, "in" should read --with--;
line 34, "chuck 108" should read --chuck 101--;
line 38, "wX," should read --ωx,--;
line 39, "wY and wZ," should read --ωy and ωz,--;
line 42, "wZ" should read --ωz--;
line 46, "rubber 109," should read --rubber member109,--;
line 48, "wZ" should read --ωz--;
line 49, "rubber 109" should read --rubber member 109--;
line 55, "wX, wY and wZ" should read --ωx, ωy and ωz--;
line 57, "are" should be deleted;
line 58, "communicated" should read --communicate--;
line 64, "can not" should read --cannot--; and
line 67, "wafer" should read --a wafer--.

UNITED STATES PATENT AND TRADEMARK OFFICE
CERTIFICATE OF CORRECTION

PATENT NO. : 5,413,167
DATED : May 9, 1995
INVENTOR(S) : SHINICHI HARA, ET AL.

It is certified that error appears in the above-indentified patent and that said Letters Patent is hereby corrected as shown below:

COLUMN 2, line 53, "a" (both occurrences) should be deleted.

COLUMN 3, line 41, "used" should be deleted;
    line 42, "pipe" should read --pipe used--;
    line 44, "Where" should read --When--;
    line 48, "Where" should read --When--;
    line 55, "In" should read --On-- and "where" should read --when--; and
    line 67, "Where" should read --When--.

COLUMN 4, line 47, "in" should read --with--;
    line 57, "wX, wY" should read --$\omega x, \omega y$--;
    line 58, "wZ" should read --$\omega z$--;
    line 61, "wz" should read --$\omega z$--;
    line 66, "rubber 9," should read --rubber member 9,--; and
    line 67, "wZ" should read --$\omega z$--.

UNITED STATES PATENT AND TRADEMARK OFFICE
CERTIFICATE OF CORRECTION

PATENT NO. : 5,413,167
DATED : May 9, 1995
INVENTOR(S) : SHINICHI HARA, ET AL.

It is certified that error appears in the above-indentified patent and that said Letters Patent is hereby corrected as shown below:

COLUMN 5, line 1, "rubber 9" should read --rubber member 9,--;
    line 5, "wX, wY and wZ" should read --$\omega x$, $\omega y$ and $\omega z$--;
    line 43, "large" should read --a large--; and
    line 46, "type" should read --type of--.

COLUMN 6, line 40, "wX, wY and wZ" should read --$\omega x$, $\omega y$ and $\omega z$--.

COLUMN 7, line 4, "to" should be deleted; and
    line 33, "contacted to" should read --contacting--.

UNITED STATES PATENT AND TRADEMARK OFFICE
CERTIFICATE OF CORRECTION

PATENT NO. : 5,413,167                             Page 4 of 5
DATED : May 9, 1995
INVENTOR(S) : SHINICHI HARA, ET AL.

It is certified that error appears in the above-indentified patent and that said Letters Patent is hereby corrected as shown below:

COLUMN 8, line 16, "contacted to" should read --contacting--;
    line 31, "exposures" should read --exposure,--;
    line 45, "as of" should read --as that of--; and
    line 53, "contacted to" should read --contacting--.

COLUMN 9, line 7, "being contacted to" should read --contacting--;
    line 12, "fifth" should read --fourth--;
    line 36, "where" should read --when--;
    line 37, "structure" should read --structure as that--;
    line 41, "describe" should read --described--;
    line 43, "similarly" should read --similar--;
    line 57, "contacted to" should read --contacting--; and
    line 65, "as of" should read --as that of--.

UNITED STATES PATENT AND TRADEMARK OFFICE
CERTIFICATE OF CORRECTION

PATENT NO. : 5,413,167
DATED : May 9, 1995
INVENTOR(S) : SHINICHI HARA, ET AL.

It is certified that error appears in the above-indentified patent and that said Letters Patent is hereby corrected as shown below:

<u>COLUMN 10,</u>

```
line 11, "such" should read --such a--;
line 15, "such" should read --such a--; and
line 36, "for" should read --to--.
```

Signed and Sealed this

Nineteenth Day of December, 1995

Attest:

BRUCE LEHMAN

*Attesting Officer*     *Commissioner of Patents and Trademarks*